United States Patent
Kume et al.

(10) Patent No.: US 10,468,334 B2
(45) Date of Patent: Nov. 5, 2019

(54) SEMICONDUCTOR DEVICE AND MANUFACTURING METHOD THEREOF

(71) Applicant: TOSHIBA MEMORY CORPORATION, Minato-ku (JP)

(72) Inventors: Ippei Kume, Yokkaichi (JP); Kazuhiko Nakamura, Nagoya (JP); Yuki Noda, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/702,084

(22) Filed: Sep. 12, 2017

(65) Prior Publication Data

US 2018/0269133 A1 Sep. 20, 2018

(30) Foreign Application Priority Data

Mar. 17, 2017 (JP) ................. 2017-053588

(51) Int. Cl.
*H01L 23/48* (2006.01)
*H01L 21/3065* (2006.01)
(Continued)

(52) U.S. Cl.
CPC ........ *H01L 23/481* (2013.01); *H01L 21/3065* (2013.01); *H01L 21/76831* (2013.01); *H01L 21/76877* (2013.01); *H01L 21/76898* (2013.01); *H01L 23/5283* (2013.01); *H01L 21/31116* (2013.01); *H01L 21/31144* (2013.01); *H01L 23/5329* (2013.01); *H01L 23/53209* (2013.01);
(Continued)

(58) Field of Classification Search
CPC ............... H01L 24/481; H01L 21/3065; H01L 21/76898; H01L 23/481
See application file for complete search history.

(56) References Cited

U.S. PATENT DOCUMENTS 7,808,064 B2 10/2010 Kawasaki et al.
8,299,624 B2 10/2012 Matsuo
(Continued)

FOREIGN PATENT DOCUMENTS

JP 4799542 10/2011
JP 2014-110284 6/2014
(Continued)

*Primary Examiner* — Zandra V Smith
*Assistant Examiner* — John M Parker
(74) *Attorney, Agent, or Firm* — Oblon, McClelland, Maier & Neustadt, L.L.P.

(57) ABSTRACT

A semiconductor device according to an embodiment includes a semiconductor substrate including a first face having semiconductor elements, and a second face on an opposite side to the first face. A first insulating film is located on the first face of the semiconductor substrate. A conductor is located on the first insulating film. A metal electrode is located between the first face and the second face and passes through the semiconductor substrate to be in contact with the conductor. A second insulating film is located between the metal electrode and the semiconductor substrate. A boundary face between the first insulating film and the second insulating film is located on a side of the conductor relative to the first face of the semiconductor substrate and is inclined to approach the conductor toward a center portion of the metal electrode.

16 Claims, 8 Drawing Sheets

(51) Int. Cl.
*H01L 21/768* (2006.01)
*H01L 23/528* (2006.01)
*H01L 29/06* (2006.01)
*H01L 21/311* (2006.01)
*H01L 23/532* (2006.01)
*H01L 23/00* (2006.01)

(52) U.S. Cl.
CPC .............. *H01L 24/05* (2013.01); *H01L 24/13* (2013.01); *H01L 29/0649* (2013.01); *H01L 2224/05025* (2013.01); *H01L 2224/05147* (2013.01); *H01L 2224/13025* (2013.01); *H01L 2224/13111* (2013.01); *H01L 2224/13147* (2013.01); *H01L 2924/14511* (2013.01)

(56) References Cited

U.S. PATENT DOCUMENTS

| | | |
|---|---|---|
| 8,471,367 B2 | 6/2013 | Saito et al. |
| 9,275,933 B2 | 3/2016 | Kuo et al. |
| 2011/0089571 A1* | 4/2011 | Matsuo ............... H01L 21/6835 257/774 |
| 2011/0304026 A1* | 12/2011 | Tsui .................. H01L 21/76898 257/621 |
| 2012/0104563 A1* | 5/2012 | Saito ................. H01L 21/76898 257/621 |

FOREIGN PATENT DOCUMENTS

| | | |
|---|---|---|
| JP | 5532394 | 6/2014 |
| JP | 5873145 | 3/2016 |

\* cited by examiner

US 10,468,334 B2

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2017-053588, filed on Mar. 17, 2017, the entire contents of which are incorporated herein by reference.

FIELD

The embodiments of the present invention relate to a semiconductor device and manufacturing method thereof.

BACKGROUND

Semiconductor chips such as a semiconductor memory are stacked in some cases from the viewpoint of high functionality or high integration. In order to electrically connect elements on the stacked semiconductor chips to each other, through electrodes called TSV (Through-Silicon Via) are used. A TSV passes through a substrate and electrically connects elements on the substrate and elements on another substrate together. In order not to affect the characteristics of the elements, the TSV is demanded to be low in the parasitic resistance and the parasitic capacitance.

Although the TSV itself is formed of a metal and has a low resistance, the aspect ratio of a contact hole for the TSV formed in the substrate is high. Accordingly, there is a problem that the contact area between the TSV and wires at the bottom of the contact hole is small and the contact resistance between the TSV and the wires is high.

DETAILED DESCRIPTION

A semiconductor device according to an embodiment includes a semiconductor substrate comprising a first face comprising semiconductor elements, and a second face on an opposite side to the first face. A first insulating film is provided on the first face of the semiconductor substrate. A conductor is provided on the first insulating film. A metal electrode is provided between the first face and the second face and passes through the semiconductor substrate to be in contact with the conductor. A second insulating film is provided between the metal electrode and the semiconductor substrate. A boundary face between the first insulating film and the second insulating film is located on a side of the conductor relative to the first face of the semiconductor substrate and is inclined to approach the conductor toward a center portion of the metal electrode.

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

First Embodiment

Figure 1:
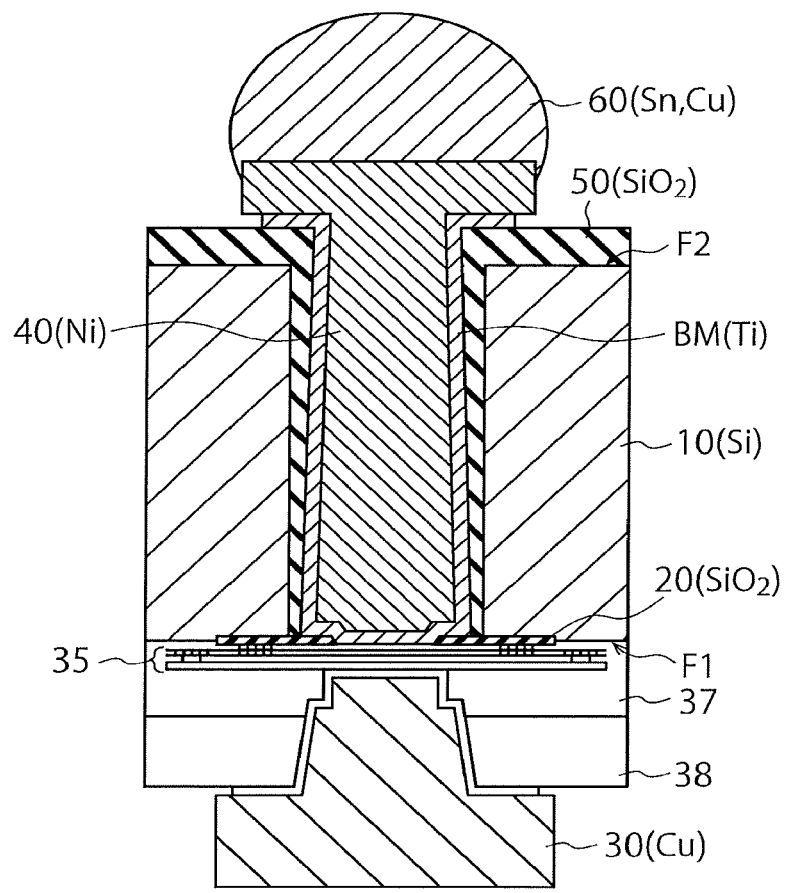
FIG. 1 is a sectional view illustrating a configuration example of a semiconductor chip according to a first embodiment.

FIG. 1 is a sectional view illustrating a configuration example of a semiconductor chip according to a first embodiment. A semiconductor chip 1 can be, for example, a semiconductor chip having a NAND EEPROM (Electrically Erasable and Programmable Read-Only Memory). FIG. 1 illustrates a TSV in the semiconductor chip 1 and a peripheral portion thereof.

The semiconductor chip 1 includes a semiconductor substrate 10, an STI (Shallow Trench Isolation) 20, a pad (bump) 30, a TSV 40, a spacer film 50, and a bump 60.

The semiconductor substrate 10 is, for example, a silicon substrate and is thinned to be about 30 micrometers or less, for example. The semiconductor substrate 10 has a first face F1, and a second face F2 on the opposite side to the first face F1. The first face F1 of the semiconductor substrate 10 has active areas on which semiconductor elements are formed, and the STI 20 that electrically separates the active areas from each other. Semiconductor elements (not illustrated) such as a memory cell array, a transistor, a resistor element, and a capacitor element are formed in the active areas. An insulating film such as a silicon dioxide film is, for example, used as the STI 20. While no semiconductor elements are provided on the STI 20, the pad 30 and a wiring structure 35 for electrically connecting the semiconductor elements to the TSV 40 are provided thereon. In the following descriptions, the pad 30 and the wiring structure 35 are also collectively referred to as "conductors 30 and 35". While no semiconductor elements or wires are provided on the second face F2 of the semiconductor substrate 10, the bump 60, and the like electrically connected to the TSV 40 are provided thereon.

The STI 20 serving as a first insulating film is provided on the first face F1 of the semiconductor substrate 10. As described above, an insulating film such as a silicon dioxide film is, for example, used as the STI 20.

The conductors 30 and 35 are provided on the STI 20 and are electrically connected to the semiconductor elements (a transistor, for example) provided on the first face F1 of the semiconductor substrate 10. A low-resistance metal such as copper, tungsten or titanium is used for the pad 30. For example, polysilicon or a low-resistance metal such as those described above is used for the wiring structure 35.

The TSV 40 and a barrier metal BM being metal electrodes are provided between the first face F1 and the second face F2 of the semiconductor substrate 10 and pass through the semiconductor substrate 10. The TSV 40 and the barrier metal BM further pass through the STI 20 and are electrically connected to the conductors 30 and 35. In this manner, the TSV 40 and the barrier metal BM extend electrical connection to the conductors 30 and 35 located on the side of the first face F1 to the side of the second face F2. A low-resistance metal such as nickel is used as the TSV 40, for example. The barrier metal BM is provided on a side face of the spacer film 50. For example, Ti, Ta, or Ru, or a stacked film thereof is used for the barrier metal BM. The TSV 40 and the barrier metal BM are hereinafter also collectively referred to as "metal electrodes 40 and BM". As long as the TSV 40 can be satisfactorily embedded in a contact hole CH, the barrier metal BM does not always need to be provided.

The spacer film 50 serving as a second insulating film is provided between the metal electrodes 40 and BM and the semiconductor substrate 10 and electrically separates the metal electrodes 40 and BM from the semiconductor substrate 10. The spacer film 50 is also provided on the second face F2 of the second substrate 10. An insulating film such as a silicon dioxide film is, for example, used as the spacer film 50.

The bump 60 is provided on the TSV 40 on the side of the second face F2 of the semiconductor substrate 10. A metal such as tin or copper is used for the bump 60.

Figure 2:
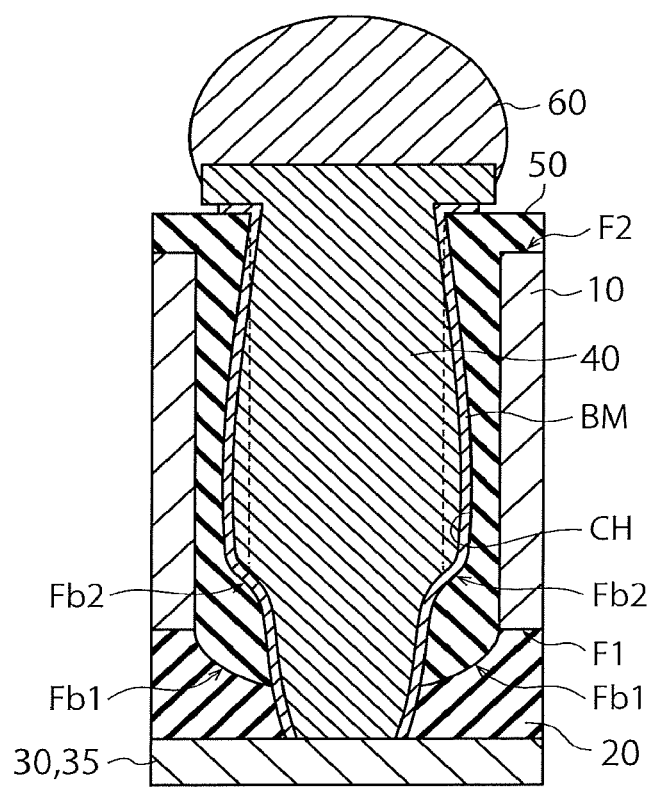
FIG. 2 is a sectional view illustrating the configuration on the side of the second face relative to the wiring structure in more detail.

FIG. 2 is a sectional view illustrating the configuration on the side of the second face F2 relative to the wiring structure 35 in more detail. FIG. 2 schematically highlights a connection portion between the TSV 40 or the barrier metal BM and the conductors 30 and 35 to facilitate the understanding.

A boundary face Fb1 between the STI 20 and the spacer film 50 is located on the side of the conductors 30 and 35 relative to the first face F1 of the semiconductor substrate 10 and is inclined to approach the conductors 30 and 35 toward a center portion of the TSV 40. That is, the boundary face Fb1 is closer to the conductors 30 and 35 than the first face F1 of the semiconductor substrate 10 and is inclined in a direction away from the semiconductor substrate 10 toward the center portion of the TSV 40. In still other words, the boundary face Fb1 is located between the semiconductor substrate 10 and the TSV 40 and gradually approaches the conductors 30 and 35 toward a center portion of the contact hole CH in which the TSV 40 is provided (the center portion of the TSV 40). That is, the thickness of the STI 20 is thinned toward the center portion of the TSV 40 in a region where the contact hole CH is provided.

Associated with the inclination of the boundary face Fb1, a boundary face Fb2 between the TSV 40 or the barrier metal BM and the spacer film 50 or the STI 20 is also inclined along the boundary face Fb1. For example, the boundary face Fb2 has an inverse tapered shape to some extent or is a face substantially perpendicular to the first face F1 near the second face F2 of the semiconductor substrate 10 (at an upper part of the TSV 40). The boundary face Fb2 approaches the center portion of the TSV 40 just above the boundary face Fb1 near the first face F1 of the semiconductor substrate 10 and is inclined to be closer to the conductors 30 and 35 toward the center portion of the TSV 40. The boundary face Fb2 further becomes more perpendicular to the first face F1 and reaches the conductors 30 and 35.

As described above, according to the present embodiment, the inner side face of the spacer film 50 between the semiconductor substrate 10 and the metal electrode 40 and BM has almost no face substantially parallel to the first face F1 and extends substantially perpendicularly to the first face F1 or is smoothly inclined with respect thereto.

Figure 3:
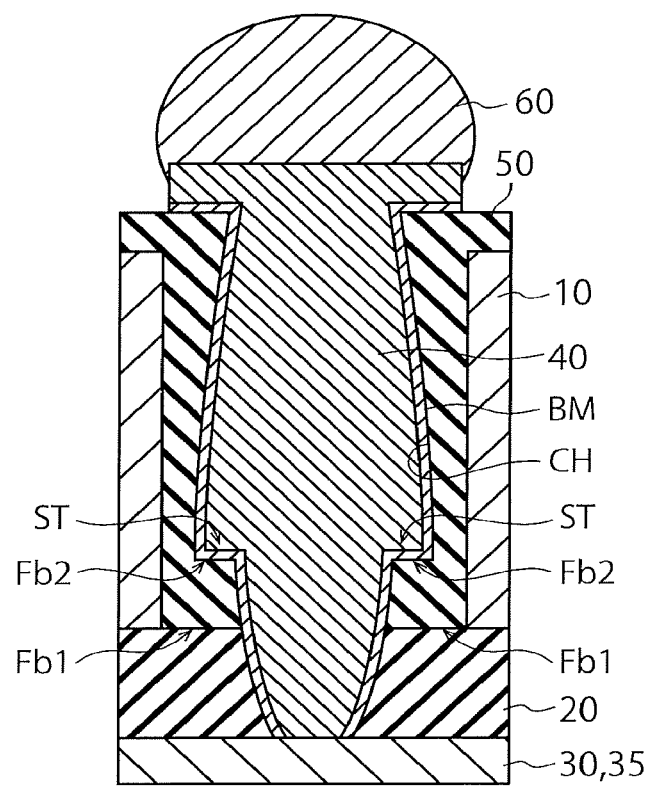
FIG. 3 is a sectional view illustrating a structure in which the boundary face is not inclined.
Figure 4:
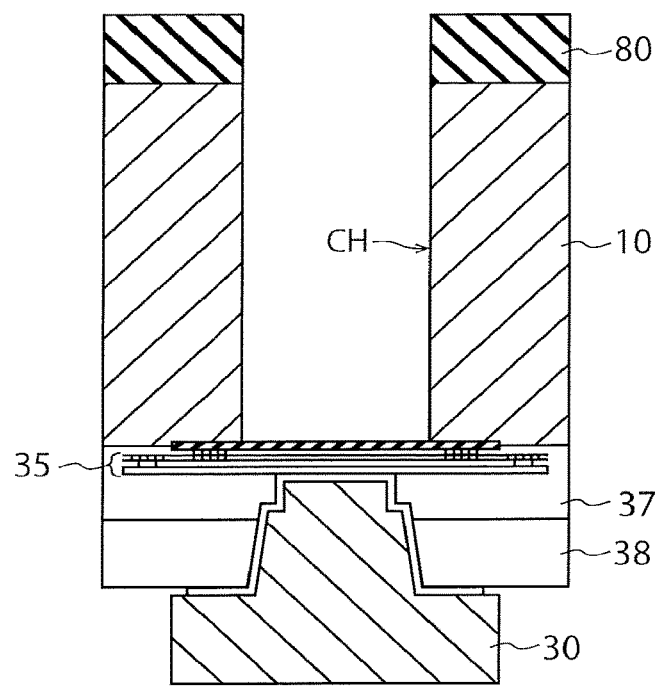
FIGS. 4 to 7 are sectional views illustrating an example of the manufacturing method of a semiconductor chip according to the first embodiment.

FIG. 3 is a sectional view illustrating a structure in which the boundary face Fb1 is not inclined. If the boundary face Fb1 is not inclined and is substantially parallel to the first face F1 or the second face F2 of the semiconductor substrate 10 (for example, substantially flush with the first face F1) as in FIG. 3, the boundary face Fb2 is also substantially parallel to the first face F1 or the second face F2 of the semiconductor substrate 10. In this case, the thickness of a part of the STI 20 just under the spacer film 50 is substantially the same as that of a part of the STI 20 under the semiconductor substrate 10. Therefore, the bottom area of the contact hole CH is reduced and the contact resistance between the TSV 40 and the barrier metal BM, and the conductors 30 and 35 is increased. If the boundary face Fb1 is not inclined and is substantially flush with the first face F1, the inner side face of the spacer film 50 has a step ST as illustrated in FIG. 3. If the inner side face of the spacer film 50 has the step ST, coverage of the barrier metal provided on the inner side face of the spacer film 50 is deteriorated and the metal material of the TSV 40 becomes hard to fill.

On the other hand, according to the present embodiment, the inner side face of the spacer film 50 between the semiconductor substrate 10 and the metal electrodes 40 and BM has almost no face substantially parallel to the first face F1 and extends substantially perpendicularly to the first face F1 or is smoothly inclined with respect thereto as illustrated in FIG. 2. Accordingly, the thickness of the STI 20 is thinned toward the center portion of the metal electrodes 40 and BM in a lower region of the contact hole CH. In this case, the sum of the film thicknesses of the spacer film 50 and the STI 20 is reduced toward the center portion of the contact hole CH. Therefore, in etching the bottom of the contact hole CH, the contact hole CH is more easily penetrated through the spacer film 50 and the STI 20. Accordingly, the diameter of the contact hole CH formed in the spacer film 50 and the STI 20 becomes large even with overetching for a short time. This characteristic enables the bottom area of the contact hole CH to be relatively large and can lower the contact resistance between the metal electrodes 40 and BM and the conductors 30 and 35. Furthermore, the overetching time can be reduced in etching of the bottom of the contact hole CH and thus piercing of the contact hole CH through the wiring structure 35 can be suppressed.

The inner side face of the spacer film 50 between the semiconductor substrate 10 and the metal electrodes 40 and BM extends substantially perpendicularly to the first face F1 or is smoothly inclined with respect thereto (more perpendicular than the boundary faces Fb1 and Fb2). Accordingly, there is no step ST on the inner side face of the spacer film 50 and the coverage of the barrier metal BM becomes satisfactory. Therefore, the metal material of the TSV 40 is also relatively easy to fill.

A manufacturing method of the semiconductor chip 1 according to the present embodiment is explained next.

Figure 5:
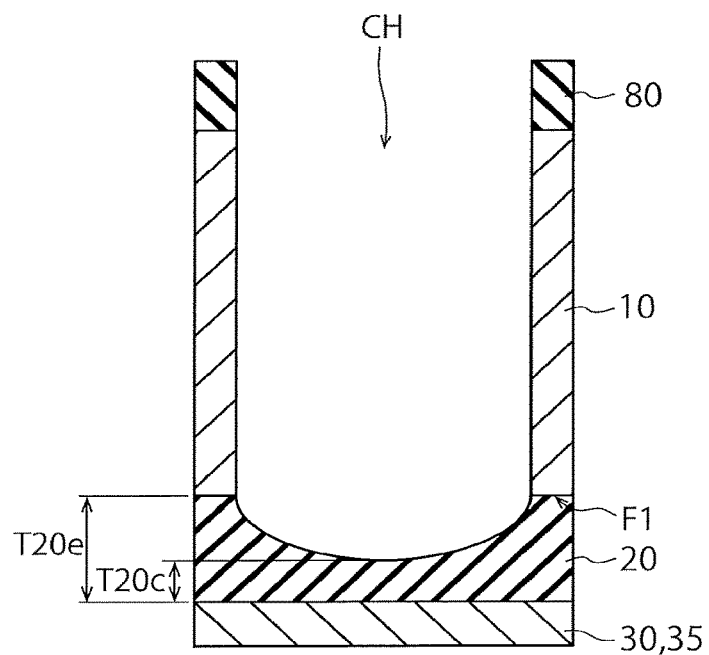
Figure 6:
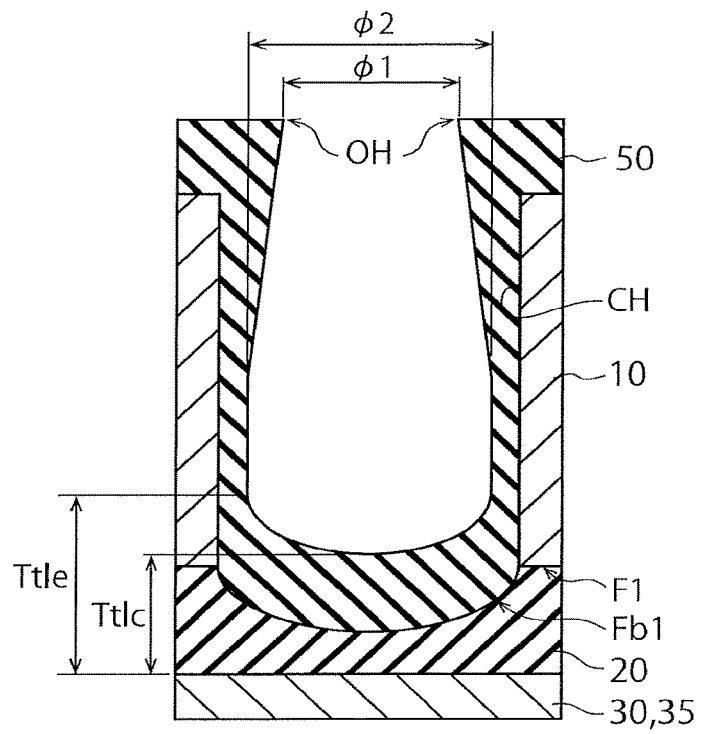
Figure 7:
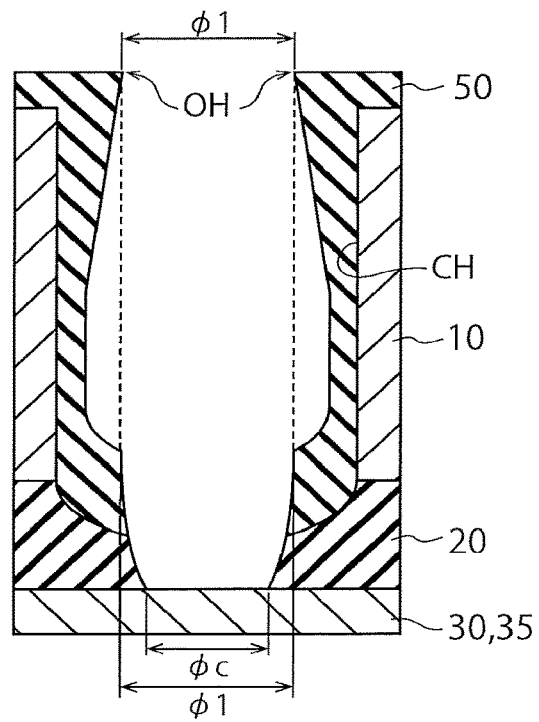

FIGS. 4 to 7 are sectional views illustrating an example of the manufacturing method of a semiconductor chip according to the first embodiment. FIGS. 5 to 7 are schematic sectional views identical to FIG. 2 to facilitate understanding of a forming method of the connection portion between the TSV 40 or the barrier metal BM and the conductors 30 and 35.

A method of forming the TSV 40 in the semiconductor chip 1 is mainly explained below.

First, the STI 20 is formed on the first face F1 of the semiconductor substrate 1 to define the active areas. The semiconductor substrate 10 is, for example, a silicon substrate. The STI 20 is, for example, a silicon dioxide film. Next, semiconductor elements (not illustrated) are formed in the active areas. The semiconductor elements can be, for example, a memory cell array, a transistor, a resistor element, and a capacitor element. During formation of the semiconductor elements, the wiring structure 35 is formed on the STI 20, for example. The semiconductor elements and the wiring structure 35 are covered by insulating films 37 and 38. Next, the pad 30 is formed to be connected to the wiring structure 35. Therefore, the conductors 30 and 35 are formed on the STI 20.

Subsequently, the semiconductor substrate 10 is etched from the second face F2 of the semiconductor substrate 10 on the opposite side to the first face F1 using a lithography technique and a RIE (Reactive Ion Etching) method. That is, the contact hole CH is formed from the second face F2 (the back face) on the opposite side to the first face F1 on which the semiconductor elements are formed, using a photoresist 80 as a mask. The contact hole CH extending from the second face F2 to reach the first face F1 is thus formed. To connect the TSV 40 to the conductors 30 and 35, the contact hole CH is formed in a region where the conductors 30 and 35 are located in the region of the STI 20. The STI 20 is exposed due to formation of the contact hole CH.

Next, as illustrated in FIG. 5, a part of the STI 20 located on the bottom face of the contact hole CH is etched using the RIE method. At this time, an etching gas for the material (a silicon dioxide film, for example) of the STI 20 is different from that for the material (silicon, for example) of the semiconductor substrate 10. For example, the etching gas for silicon is a $SF_6$, $SiF_4$, $CF_4$, $C_4F_8$, Ar, HBr, or $O_2$ gas, or a mixed gas thereof. The etching gas for the silicon dioxide film is, for example, a $CF_4$, $CHF_3$, Ar, or $O_2$ gas, or a mixed gas thereof. Therefore, etching of the STI 20 is a different step from that of etching the semiconductor substrate 10. For example, after the semiconductor substrate 10 is etched, the STI 20 can be etched by a device different from a device that has etched the semiconductor substrate 10. Alternatively, the etching of the STI 20 can be performed in the same device that has performed the etching of the semiconductor substrate 10. In this case, however, the etching gas needs to be changed.

Ions of the etching gas are harder to reach end portions of the bottom of the contact hole CH than the center portion thereof. Therefore, as illustrated in FIG. 5, a film thickness T20c of the center portion of the STI 20 is smaller than a film thickness T20e of the end portions thereof at the bottom of the contact hole CH. Accordingly, the bottom face of the contact hole CH is concaved in the shape of a bowl. That is, the bottom face of the contact hole CH is concaved to the side of the conductors 30 and 35 relative to the first face F1 of the semiconductor substrate 10 and is inclined to approach the conductors 30 and 35 toward the center portion of the contact hole CH. Therefore, the thickness of the STI 20 is reduced toward the center portion of the contact hole CH.

After removal of the photoresist 80, the spacer film 50 is formed on the inner side face and the bottom face of the contact hole CH and on the second face F2 of the semiconductor substrate 10 using a CVD (Chemical Vapor Deposition) method or an ALD (Atomic Layer Deposition) method as illustrated in FIG. 6. Because the spacer film 50 is formed along the inner face of the contact hole CH, the spacer film 50 formed on the bottom face of the contact hole CH is formed on the semiconductor substrate 10 and the STI 20 along the bowl shape of the contact hole CH with satisfactory coverage.

The spacer film 50 is concaved in the bowl shape substantially similarly to the bottom face of the contact hole CH. That is, the spacer film 50 on the bottom face of the contact hole CH is inclined to approach the conductors 30 and 35 toward the center portion of the contact hole CH. Associated therewith, the boundary face Fb1 between the STI 20 and the spacer film 50 is also located on the side of the conductors 30 and 35 relative to the first face F1 of the semiconductor substrate 10 and is inclined to approach the conductors 30 and 35 toward the center portion of the contact hole CH. That is, the boundary face Fb1 is closer to the conductors 30 and 35 than the first face f1 of the semiconductor substrate 10 and is inclined in a direction away from the semiconductor substrate 10 toward the center portion of the contact hole CH in which the TSV 40 is filled.

Because the aspect ratio of the contact hole CH is relatively high in practice, the spacer film 50 formed on the opening of the contact hole CH becomes thicker than the spacer film 50 formed in the inner part of the contact hole CH. Therefore, as illustrated in FIG. 6, the spacer film 50 protrudes in a direction substantially parallel to the first face F1 at an opening end of the contact hole CH. In the following descriptions, a portion of the spacer film 50 protruding at the opening end of the contact hole CH is also referred to as "overhang portion OH". The overhang portion OH of the spacer film 50 causes the opening diameter of the contact hole CH to be slightly narrower than the diameter of the contact hole CH at a middle portion. Assuming the opening diameter of the contact hole CH at the overhang portion OH of the spacer film 50 as Ø1 and the diameter of the contact hole CH at a middle portion as Ø2, Ø1<Ø2 as illustrated in FIG. 6.

Next, as illustrated in FIG. 7, the spacer film 50 and the STI 20 at the bottom of the contact hole CH are etched by the RIE method using the spacer film 50 on the inner side face of the contact hole CH and on the second face F2 of the semiconductor substrate 10 as a mask. In this manner, the contact hole CH penetrates through the spacer film 50 and the STI 20 to reach the conductors 30 and 35 located under the STI 20. That is, the contact hole CH is elongated to the conductors 30 and 35 under the STI 20. At this time, as described above, the opening diameter Ø1 of the contact hole CH is caused to be narrower than the diameter Ø2 of the contact hole CH at a middle portion due to the overhang portion OH of the spacer film 50. The spacer film 50 and the STI 20 at the bottom of the contact hole CH are etched using the overhang portion OH of the spacer film 50 as a mask. Therefore, the diameter of a lower part of the contact hole CH formed in the spacer film 50 and the STI 20 is substantially Ø1.

Meanwhile, the bottom face of the contact hole CH is concaved in the bowl shape and a sum Ttlc of the film thicknesses of the STI 20 and the spacer film 50 at the center portion is smaller than a sum Ttle of the film thicknesses thereof at the end portions. Therefore, the spacer film 50 and the STI 20 are easily penetrated through and the diameter Øc of the contact hole CH formed in the spacer film 50 and the STI 20 can be made relatively large even with overetching for a short time. Accordingly, the contact resistance between the TSV 40 formed next and the conductors 30 and 35 is lowered. Because the time of the overetching can be shortened, the contact hole CH can be suppressed from piercing through the wiring structure 35.

Furthermore, due to the bottom face of the contact hole CH concaved in the bowl shape, the inner side face of the contact hole CH has almost no face substantially parallel to the first face F1 and extends in a direction substantially perpendicular to the first face F1 or is smoothly inclined with respect thereto. That is, the inner side face of the contact hole CH is a smooth inclined face having almost no steps. Accordingly, the coverage of the barrier metal BM and the TSV 40 explained next becomes satisfactory.

Next, as illustrated in FIG. 2, the barrier metal BM is formed in the contact hole CH and the metal material of the TSV 40 is deposited thereon. In this manner, the metal electrodes 40 and BM are formed in the contact hole CH. For example, Ti, Ta, Ru, or a stacked film thereof is used as the barrier metal BM. For the TSV 40, a metal material such as nickel is used, for example. This characteristic enables the metal electrodes 40 and BM to be connected to the conductors 30 and 35 and be drawn out toward the second face F2. At this time, the inner side face of the contact hole CH is a smooth inclined face having almost no steps as described above. Accordingly, the coverage of the metal materials of the barrier metal BM and the TSV 40 becomes satisfactory.

Subsequently, the TSV 40 and the barrier metal BM are processed using the lithography technique and the RIE method. Accordingly, the materials of the TSV 40 and the barrier metal BM on the second face F2 (field) are removed.

Next, as illustrated in FIG. 2, the bump 60 is formed on the TSV 40 using a plating method or the like. For example, tin is used as the bump 60. The semiconductor chip 1 according to the present embodiment is thus completed. The semiconductor chip 1 are thereafter stacked on other semiconductor chips and can be electrically connected to other semiconductor chips via the TSV 40, the bump 60, and the like.

In this way, according to the present embodiment, after the semiconductor substrate 10 is etched and before the spacer film 50 is formed, an upper part of the STI 20 at the bottom of the contact hole CH is etched. Accordingly, the bottom of the contact hole CH is concaved in the bowl shape and the coverage of the spacer film 50 becomes satisfactory. Furthermore, the spacer film 50 is also concaved in the bowl shape substantially similarly to the bottom face of the contact hole CH. The thicknesses of the STI 20 and the spacer film 50 are thereby thinned toward the center portion of the contact hole CH or the TSV 40. This configuration enables the contact hole CH to easily penetrate through the spacer film 50 and the STI 20 in etching the bottom of the contact hole CH. Therefore, the diameter of the contact hole CH formed in the spacer film 50 and the STI 20 becomes relatively large and the contact resistance between the metal electrodes 40 and BM and the conductors 30 and 35 is lowered. Because the time of the overetching can be shortened, the contact hole CH can be suppressed from piercing through the wiring structure 35. Furthermore, because the inner side face of the spacer film 50 has no steps ST, satisfactory coverage of the metal materials of the barrier metal BM and the TSV 40 is obtained.

Second Embodiment

Figure 8:
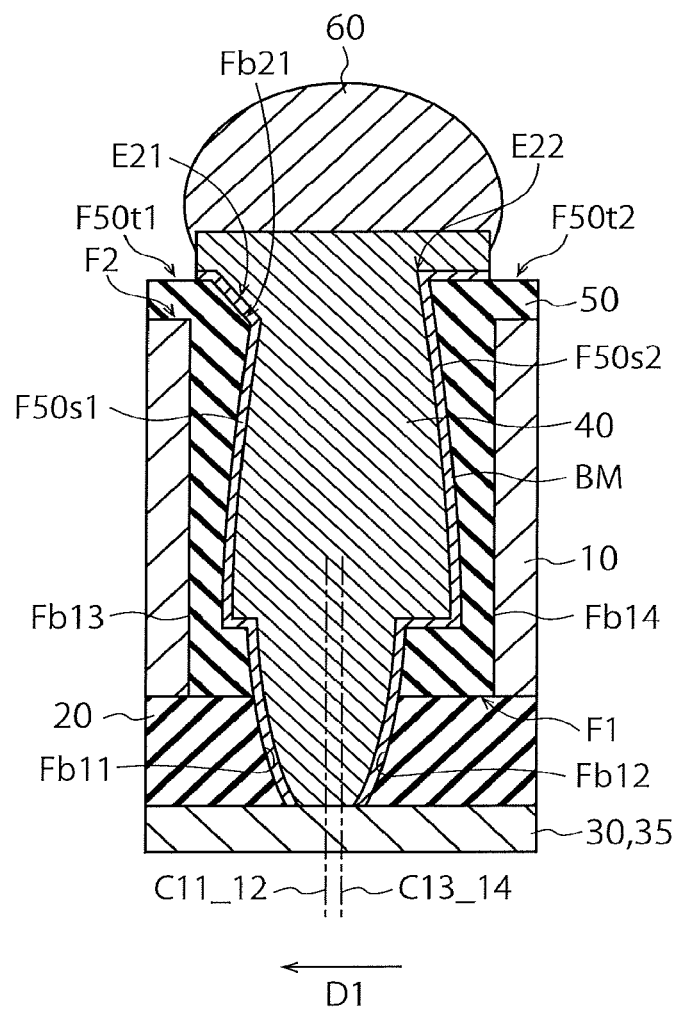
FIG. 8 is a sectional view illustrating a configuration example of a semiconductor chip according to a second embodiment.

FIG. 8 is a sectional view illustrating a configuration example of a semiconductor chip according to a second embodiment. The semiconductor chip 1 in the second embodiment is different from that in the first embodiment in the shapes of the TSV 40, the spacer film 50, and the like. Other constituent elements of the second embodiment can be identical to the corresponding ones in the first embodiment. FIG. 8 also schematically highlights a connection portion between the TSV 40 or the barrier metal BM and the conductors 30 and 35 to facilitate understanding, similarly to FIG. 2.

In a cross-section of the semiconductor chip 1 according to the second embodiment in a direction substantially perpendicular to the first face F1 and the second face F2 of the semiconductor substrate 10, boundary faces between the metal electrodes 40 and BM and the STI 20 on both sides of the metal electrodes 40 and BM are a first boundary face Fb11 and a second boundary face Fb12, and boundary faces between the spacer film 50 and the semiconductor substrate 10 on the both sides of the metal electrodes 40 and BM are a third boundary face Fb13 and a fourth boundary face Fb14. At this time, a center C11_12 between the first boundary face Fb11 and the second boundary face Fb12 is deviated in a first direction D1 from a center C13_14 between the third boundary face Fb13 and the fourth boundary face Fb14.

One boundary face Fb21 of the boundary faces between the metal electrodes 40 and BM and the spacer film 50 on the side of the second face F2 of the semiconductor substrate 10, which is located in the first direction D1, is bent (rounded) at an end E21 on the side of the second face F2. That is, the end E21 between a top face F50$t$1 of the spacer film 50 and a side face F50$s$1 thereof is cut as being chamfered and is inclined with respect to both the top face F50$t$1 and the side face F50$s$1. Meanwhile, one of the boundary faces between the metal electrodes 40 and BM and the spacer film 50, which is located in the opposite direction to the first direction D1, is not bent at an end E22 on the side of the second face F2. That is, the end E22 between a top face F50$t$2 of the spacer film 50 and a side face F50$s$2 thereof is not chamfered and is substantially flush with either the top face F50$t$2 or the side face F50$s$2.

In this way, the direction D1 in which the center C11_12 between the first boundary face Fb11 and the second boundary face Fb12 is deviated is substantially the same direction as that in which a bent boundary face Fb21 is provided, as seen from the center of the TSV 40. This structure is formed by a manufacturing method of the semiconductor chip 1 described below.

Figure 9:
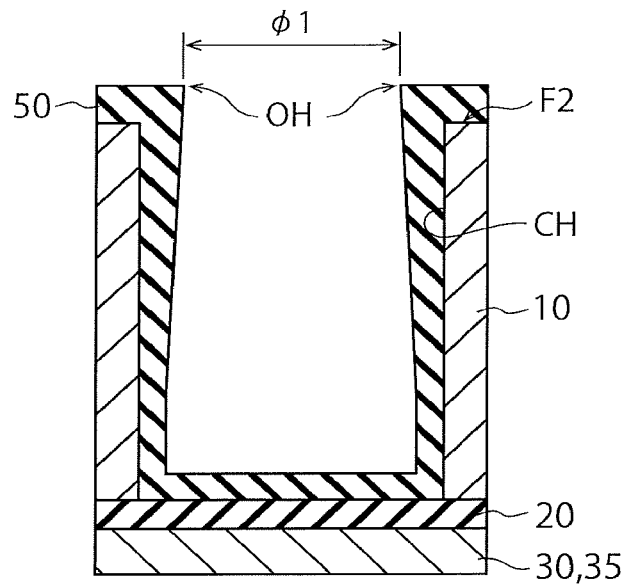
FIGS. 9 to 11 are sectional views illustrating an example of the manufacturing method of a semiconductor chip according to the second embodiment.
Figure 10:
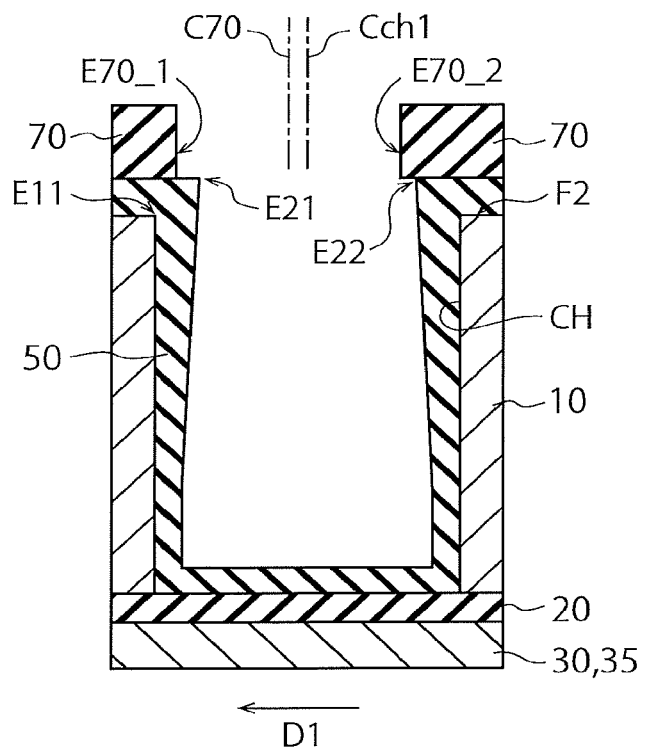
Figure 11:
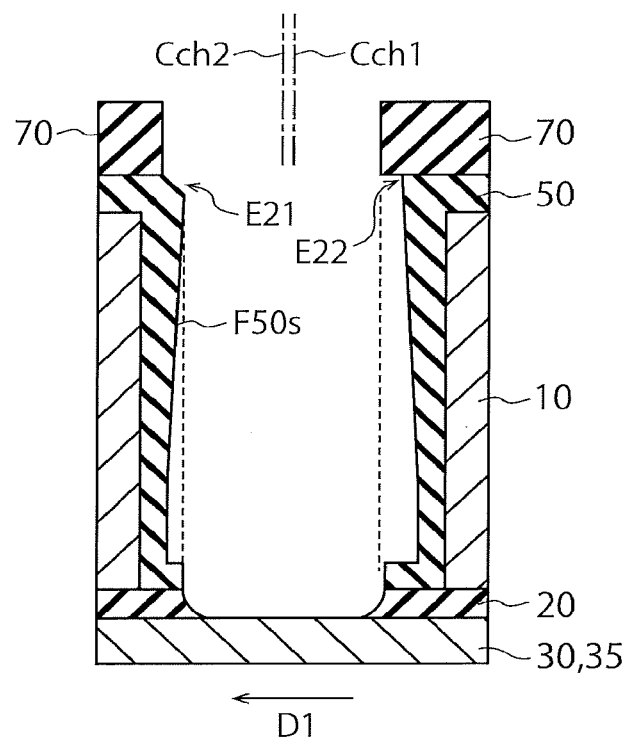

FIGS. 9 to 11 are sectional views illustrating an example of the manufacturing method of a semiconductor chip according to the second embodiment. A method of forming the TSV 40 in the semiconductor chip 1 is mainly explained below.

Steps until the contact hole CH is formed can be identical to those in the first embodiment. In the second embodiment, the STI 20 on the bottom face of the contact hole CH is not etched at this stage. Therefore, the bottom face of the contact hole CH is still substantially parallel to the first or second face F1 or F2.

Next, as illustrated in FIG. 9, the spacer film 50 is formed on the inner side face of the contact hole CH, the bottom face of the contact hole CH, and the second face F2 of the semiconductor substrate 10 using the CVD method or the ALD method. At this time, the aspect ratio of the contact hole CH is relatively high and thus the spacer film 50 has an overhang portion OH at an opening end of the contact hole CH. As explained later, a resist film 70 is formed on the spacer film 50 located on the second face F2. This configuration increases the film thickness of the spacer film 50 on the second face F2 by the thickness of the resist film 70 and thus the film thickness of a mask material including the spacer film 50 and the resist film 70 becomes sufficiently large. Therefore, the spacer film 50 does not need to be formed to be excessively thick in view of the function as a mask material and can be relatively thin. Due to the formation of the thinner spacer film 50, the overhang portion OH of the spacer film 50 is reduced. This configuration enables the opening diameter Ø1 of the contact hole CH to be relatively large. As a result, the contact area between the metal electrodes 40 and BM and the conductors 30 and 35 is increased and the contact resistance is reduced.

Next, as illustrated in FIG. 10, the resist film 70 is formed as a part of the mask material on the spacer film 50 located on the second face F2 of the semiconductor substrate 10 using the lithography technique. When the resist film 70 is coated on the second face F2 of the semiconductor substrate 10, the resist film 70 can enter the contact hole CH or the resist film 70 does not need to enter therein. The resist film 70 is exposed to light and developed, whereby the resist film 70 located on the contact hole CH is removed and the other resist film 70 is left. Accordingly, an opening portion OP70 of the resist film 70 is formed to substantially correspond to an opening portion OPch of the contact hole CH as illustrated in FIG. 10.

However, a center C70 of the opening portion OP70 of the resist film 70 is not aligned with a center Cch1 of the opening portion OPch of the contact hole CH. Accordingly, when seen from above the second face F2, one end E22 of the spacer film 50 is masked by the resist film 70 while the other end E21 thereof is exposed from the resist film 70 as illustrated in FIG. 10. For example, an end E70_1 of the resist film 70 in the direction D1 is retracted in the direction D1 behind the end E21 of the spacer film 50 in the direction D1. Meanwhile, an end E70_2 of the resist film 70 in the opposite direction to the direction D1 is protruded in the direction D1 from the end E22 of the spacer film 50 in the opposite direction to the direction D1. An amount of protrusion of the end E21 or the end E70_2 of the resist film 70 is, for example, about 1 micrometer. When seen from above the second face F2, the end E70_1 of the resist film 70 is preferably located between the end E21 of the spacer film 50 and an end E11 of the semiconductor substrate 10. This characteristic can suppress the end E21 of the spacer film 50 from excessively etched and can suppress the semiconductor substrate 10 and the metal electrodes 40 and BM from electrically short-circuiting with each other. More preferably, the end E70_1 is closer to the end E21 than an intermediate position between the end E21 of the spacer film 50 and the end E11 of the semiconductor substrate 10. Due to this configuration, electrical short-circuiting between the semiconductor substrate 10 and the metal electrodes 40 and BM can be suppressed more reliably.

Furthermore, as described above, when the resist film 70 is formed on the spacer film 50 located on the second face F2, the film thickness of the spacer film 50 can be reduced. Therefore, the overhang portion OH of the spacer film 50 can be diminished. This characteristic leads to an increase in the contact area between the metal electrodes 40 and BM and the conductors 30 and 35.

Next, as illustrated in FIG. 11, the spacer film 50 and the STI 20 at the bottom of the contact hole CH are etched by the RIE method using the resist film 70 and the spacer film 50 as a mask. At this time, the end E22 of the spacer film 50 is masked by the resist film 70 and is not etched. Therefore, the end E22 keeps having 90 degrees or an acuter angle. Meanwhile, the end E21 of the spacer film 50 is exposed from the resist film 70 and is etched. Accordingly, the end E21 of the spacer film 50 is ground as being chamfered and is rounded. The end E21 of the spacer film 50 is inclined with respect to both the top face F50t1 and the side face F50s1.

At the bottom of the contact hole CH, the spacer film 50 and the STI 20 are etched using the resist film 70 deviated in the direction D1 or the spacer film 50 as a mask. Therefore, a center Cch2 of a lower part of the contact hole CH formed in the spacer film 50 and the STI 20 is deviated in the direction D1 from the center Cch1 of an upper part of the contact hole CH formed in the semiconductor substrate 10. The amount of the deviation is substantially the same as that of the center C70 of the opening portion OP70 of the resist film 70 from the center Cch1 of the opening portion OPch of the contact hole CH. In this way, the center between the first boundary face Fb11 and the second boundary face Fb12 is deviated in the direction D1 from the center between the third boundary face Fb13 and the fourth boundary face Fb14.

Next, the barrier metal BM, the TSV 40, and the bump 60 are formed in the same manner as explained in the first embodiment. The semiconductor chip 1 according to the second embodiment illustrated in FIG. 8 is thereby completed.

With the manufacturing method according to the second embodiment, the resist film 70 is formed on the second face F2 after the spacer film 50 is formed. Accordingly, the film thickness of the mask material including the spacer film 50 and the resist film 70 becomes sufficiently large on the second face F2 and the film thickness of the spacer film 50 can be reduced. Due to reduction in the film thickness of the spacer film 50, the overhang portion OH is diminished and the opening diameter Ø1 of the contact hole CH is increased. Therefore, the contact area between the metal electrodes 40 and BM and the conductors 30 and 35 is enlarged and the contact resistance therebetween can be reduced. Furthermore, diminishment of the overhang portion OH enables the inverse tapered shape of the spacer film 50 to be lessened and thus the coverage of the metal materials of the barrier metal BM and the TSV 40 becomes satisfactory.

The second embodiment can be combined with the first embodiment. This combination further increases the contact area between the metal electrodes 40 and BM and the conductors 30 and 35 and provides more satisfactory coverage of the metal materials of the barrier metal BM and the TSV 40.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a semiconductor substrate comprising a first face comprising semiconductor elements, and a second face on an opposite side to the first face;
    a first insulating film provided on the first face of the semiconductor substrate;
    a conductor provided on the first insulating film;
    a metal electrode provided between the first face and the second face and passing through the semiconductor substrate to be in contact with the conductor; and
    a second insulating film provided between the metal electrode and the semiconductor substrate, wherein
    a first boundary face between the first insulating film and the second insulating film is located on a side of the conductor relative to the first face of the semiconductor substrate and is inclined to approach the conductor toward a center portion of the metal electrode, wherein
    a thickness of the first insulating film is thinned from the semiconductor substrate toward the center portion of the metal electrode.

2. The device of claim 1, wherein the first boundary face is located between the semiconductor substrate and the metal electrode.

3. The device of claim 1, wherein the first boundary face approaches the conductor from the semiconductor substrate toward the center portion of the metal electrode.

4. The device of claim 1, wherein a second boundary face between the metal electrode and the second insulating film, the second boundary face being located above the first boundary face, is inclined along the first boundary face.

5. The device of claim 4, wherein the second boundary face approaches the center portion of the metal electrode just above the first boundary face.

6. The device of claim 4, wherein an inner side face of a part of the second insulating film between the semiconductor substrate and the metal electrode is substantially perpendicular to the first face or has an angle to the first face which is closer to 90 degree than the angle between the first and second boundary faces and the first face.

7. A semiconductor device comprising:
a semiconductor substrate comprising a first face comprising semiconductor elements, and a second face on an opposite side to the first face;
a first insulating film provided on the first face of the semiconductor substrate;
a conductor provided on the first insulating film;
a metal electrode provided between the first face and the second face and passing through the semiconductor substrate to be in contact with the conductor; and
a second insulating film provided between the metal electrode and the semiconductor substrate, wherein
a first boundary face between the first insulating film and the second insulating film is located on a side of the conductor relative to the first face of the semiconductor substrate and is inclined to approach the conductor toward a center portion of the metal electrode,
wherein a sum of film thicknesses of the first and second insulating films is reduced from the semiconductor substrate toward the center portion of the metal electrode.

8. The device of claim 7, wherein the first boundary face is located between the semiconductor substrate and the metal electrode.

9. The device of claim 7, wherein the first boundary face approaches the conductor from the semiconductor substrate toward the center portion of the metal electrode.

10. The device of claim 7, wherein a second boundary face between the metal electrode and the second insulating film, the second boundary face being located above the first boundary face, is inclined along the first boundary face.

11. The device of claim 10, wherein the second boundary face approaches the center portion of the metal electrode just above the first boundary face.

12. The device of claim 10, wherein an inner side face of a part of the second insulating film between the semiconductor substrate and the metal electrode is substantially perpendicular to the first face or has an angle to the first face which is closer to 90 degree than the angle between the first and second boundary faces and the first face.

13. A semiconductor device comprising:
a semiconductor substrate comprising a first face comprising semiconductor elements, and a second face on an opposite side to the first face;
a first insulating film provided on the first face of the semiconductor substrate;
a conductor provided on the first insulating film;
a metal electrode provided between the first face and the second face and passing through the semiconductor substrate to be in contact with the conductor; and
a second insulating film provided between the metal electrode and the semiconductor substrate, wherein
assuming boundary faces between the metal electrode and the first insulating film on both sides of the metal electrode are first and second boundary faces and boundary faces between the second insulating film and the semiconductor substrate on both sides of the metal electrode are third and fourth boundary faces in a cross-section in a direction substantially perpendicular to the first face and the second face, a first center line is shifted from a second center line in a first direction parallel to the first face, the first center line overlapping with a center point between the first boundary face and the second boundary face and being perpendicular to the first face, the second center line overlapping with a center point between the third boundary face and the fourth boundary face and being perpendicular to the first face, and
a boundary face located on a side in the first direction out of boundary faces between the metal electrode and the second insulating film in the cross-section is bent at an end on a side of the second face.

14. The device of claim 13, wherein the boundary face on the side in the first direction out of the boundary faces between the metal electrode and the second insulating film is rounded at the end on the side of the second face in the cross-section.

15. The device of claim 14, wherein a boundary face on an opposite side to the first direction out of the boundary faces between the metal electrode and the second insulating film is not chamfered at an end on the side of the second face in the cross-section.

16. The device of claim 13, wherein a boundary face on an opposite side to the first direction out of the boundary faces between the metal electrode and the second insulating film is not chamfered at an end on the side of the second face in the cross-section.

* * * * *